United States Patent [19]

Hintermaier et al.

[11] Patent Number: 6,133,051

[45] Date of Patent: Oct. 17, 2000

[54] AMORPHOUSLY DEPOSITED METAL OXIDE CERAMIC FILMS

[75] Inventors: Frank S. Hintermaier, Munich, Germany; Bryan C. Hendrix, Danbury, Conn.; Jeffrey F. Roeder; Debra A. Desrochers, both of Brookfield, Conn.; Thomas H. Baum, New Fairfield, Conn.

[73] Assignee: Advanced Technology Materials, Inc., Danbury, Conn.

[21] Appl. No.: 09/107,861

[22] Filed: Jun. 30, 1998

[51] Int. Cl.$^7$ .................................................. H01L 21/00
[52] U.S. Cl. .............................. 438/3; 438/400; 438/100
[58] Field of Search ........................... 438/3, 400, 100

[56] References Cited

U.S. PATENT DOCUMENTS

| | | | |
|---|---|---|---|
| 2,839,421 | 6/1958 | Aibisetti | 106/287.17 |
| 3,076,834 | 2/1963 | Norton | 556/175 X |
| 4,147,556 | 4/1979 | Donley | 106/287.18 |
| 4,281,037 | 7/1981 | Choung | 427/407.3 |
| 4,401,474 | 8/1983 | Donley | 106/243 |
| 4,510,222 | 4/1985 | Okunaka et al. | 430/5 |
| 4,529,427 | 7/1985 | French | 65/3.12 |
| 4,726,938 | 2/1988 | Rollat et al. | 423/DIG. 14 |
| 4,898,842 | 2/1990 | David | 501/12 X |
| 4,908,065 | 3/1990 | Tanitsu | 106/287.19 X |
| 5,034,372 | 7/1991 | Matsuno et al. | 505/1 |
| 5,110,622 | 5/1992 | Hasegawa et al. | 427/126.1 |
| 5,120,703 | 6/1992 | Snyder et al. | 505/1 |
| 5,165,960 | 11/1992 | Platts | 427/166 |
| 5,204,314 | 4/1993 | Kirlin et al. | 505/1 |
| 5,225,561 | 7/1993 | Kirlin et al. | 546/256 |
| 5,262,199 | 11/1993 | Desu et al. | 427/255 |
| 5,280,012 | 1/1994 | Kirlin et al. | 505/1 |
| 5,376,409 | 12/1994 | Kaloyeros et al. | 427/248.1 |
| 5,412,129 | 5/1995 | DiCarolis | 556/40 |
| 5,478,610 | 12/1995 | Desu et al. | 427/573 |
| 5,536,323 | 7/1996 | Kirlin et al. | 118/726 |
| 5,648,114 | 7/1997 | Paz De Araujo et al. | 427/126.3 |
| 5,653,806 | 8/1997 | Van Buskirk et al. | 118/715 |
| 5,677,002 | 10/1997 | Kirlin et al. | 427/248.1 |
| 5,711,816 | 1/1998 | Kirlin et al. | 118/726 |
| 5,807,495 | 9/1998 | Ogi et al. | 252/62.9 |
| 5,833,745 | 11/1998 | Atsuki et al. | 106/287.18 |

OTHER PUBLICATIONS

Isobe, et al, "Characteristics of Ferroelectric $SrBi_2Ta_2O_p$ Thin Films Grown by MOCVD", *Integrated Ferroelectrics*, 1997, vol. 14, pp. 95–103.

Furkin, et al. Crystal and Molecular Structure of Bismuth Dipivaloylmethanate, *Russian Journal of Inorganic Chemistry*, 1997, vol. 38, No. 7, pp. 1119–1123.

P.C. Van Buskirk, et al., "MOCVD Growth of $BaTiO_3$ in and 8" Single Wafer CVD Reactor", *Proc. 8$^{th}$ Int. Symp. Appl. Ferroelectrics*, Aug. 30–Sep. 2, 1992, Greenville, SC, in press.

Hiskes, R., et al., "Single Source Metalorganic Chemical Vapor Deposition of Low Microwave Surface Resistance $YBa_2Cu_3O_7$," Appl. Phys. Lett. 59(5), Jul. 29, 1991, pp. 606–607.

Zhang, J., et al "Plasma Enhanced Metalorganic Chemical Vapor Deposition of Conductive Oxide Electrodes for Ferroelectric $BaTi_3$ Capacitors," Mat. Res. Soc. Symp. Proc., vol. 310, 1993, pp. 249–254.

Zhang, J. et al, "Single Liquid Source Plasma–Enhanced Metalorganic Chemical Vapor Deposition High–Quality $Yba_2Cu_3O_{7-x}$ Thin Films", Appl. Phys. Lett. 61(24), Dec. 14, 1992, pp. 2884–2886.

*Primary Examiner*—Richard Elms
*Assistant Examiner*—Pho Luu
*Attorney, Agent, or Firm*—Oliver A. Zitzman; Steven J. Hultquist

[57] ABSTRACT

A metal oxide ceramic layer is formed from an amorphous film. The metal oxide ceramic layer comprises, for example, a Bi-based oxide ceramic, The amorphous Bi-based metal oxide layer is annealed to transformed it into a ferroelectric layer. A lower thermal budget is needed to transform the amorphous Bi-based metal oxide ceramic into the ferroelectric phase.

62 Claims, 3 Drawing Sheets

AMORPHOUSLY DEPOSITED METAL OXIDE CERAMIC FILMS

FIELD OF THE INVENTION

The invention relates generally to metal oxide ceramic films used in integrated circuits (ICs). More particularly, the invention relates to chemical vapor deposition of amorphous metal oxide ceramic films capable of being transformed into ferroelectric films.

BACKGROUND OF THE INVENTION

Films capable of being transformed into ferroelectric materials have been investigated for their use in ICs due to their high remanent polarization ($2P_r$) characteristics and long term storage reliability. Various techniques, such as sol-gel, chemical vapor deposition (CVD), sputtering, pulsed laser deposition (PLD), and evaporation, have been developed for depositing such films on a substrate.

CVD techniques, however, are preferred for large scale integration applications since as such techniques deposit conformal films at small design rules, such as $\leq 0.5$ μm. CVD techniques also provide other advantages, such as good film uniformity, high film density, convenient and reliable composition control, high throughput, and low cost.

Conventional CVD techniques include introducing precursors under appropriate process conditions into a reaction chamber. The deposition temperature is between about 450–700° C. A reaction occurs, thereby depositing a film on a substrate. The as-deposited film is typically not a ferroelectric film. In some cases the as-deposited film may show poor ferroelectric characteristics, that is, low remanent polarization. An anneal, referred to as a "ferro-anneal," is often required to convert the as-deposited film into the ferroelectric film with $2P_r$ or to improve the film's $2P_r$.

The ferro-anneal needed to transform an as-deposited film formed by conventional CVD techniques into a ferroelectric film consumes a relatively high thermal budget. Typically, the ferro-anneal is carried out at 700–800° C. for about 1 hour. The high thermal budget is undesirable as it can result in the diffusion of one or more mobile elements from the as-deposited film into the substrate. For example, bismuth (Bi) atoms in Bi containing films are very mobile at high temperatures. Diffusion of mobile atoms into the substrate can adversely impact performance or functionality of the IC. Additionally, the high thermal budget combined with the oxidizing ambient of the anneal causes excessive oxidation. Excessive oxidation, particularly in the conductive materials such as the contact plug or plug, disrupts electrical conductivity between devices such as a capacitor and a transistor of a memory cell. Excessive oxidation may also blur the doping profile of, for example, the transistors.

In view of the foregoing discussion, it is desirable to provide an improved technique for forming a ferroelectric material which consumes a lower thermal budget than conventional techniques.

SUMMARY OF THE INVENTION

The invention relates to the formation of metal oxide ceramic layer. In accordance with the invention, the metal oxide ceramic layer is deposited in substantially amorphous form by chemical vapor deposition. The metal oxide ceramic is annealed. In one embodiment, the metal oxide ceramic is capable of being transformed into a ferroelectric material by the anneal. The metal oxide ceramic, for example, comprises a Bi-based oxide ceramic. By depositing the Bi-based oxide ceramic amorphously, the thermal budget consumed by the process of forming the ferroelectric material is decreased.

DETAILED DESCRIPTION OF THE INVENTION

The invention relates to metal oxide ceramic films and their applications in ICs. More particularly, the invention relates to improvements in the formation of metal oxide ceramic ferroelectric films which require a lower thermal budget as compared to conventional techniques.

In accordance with one embodiment of the invention, a metal oxide film is deposited substantially in amorphous form using CVD techniques. Preferably, the metal oxide film is capable of being transformed into a ferroelectric film. It has been discovered that by depositing the metal oxide film amorphously, a relatively lower thermal budget is required to transform the as-deposited film into a ferroelectric film. The lower thermal budget improves the performance of the ICs and manufacturing yields.

For purposes of illustration, the invention is described in the context of a ferroelectric memory cell and a ferroelectric transistor. However, the invention is significantly broader. The invention is applicable to the formation of metal oxide ceramics in general. Other applications of such films are also useful.

Figure 1:
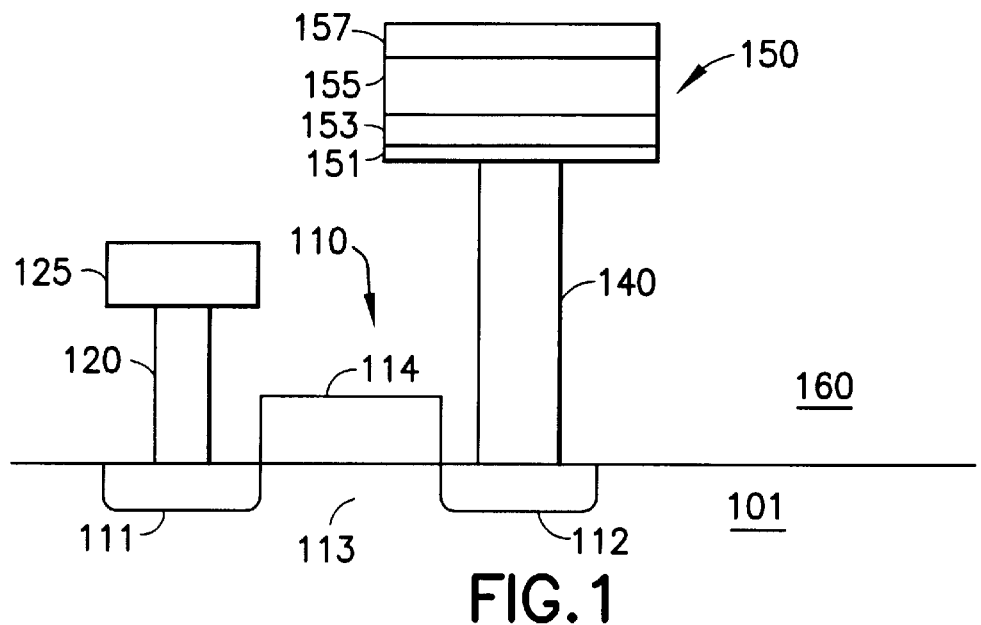
FIG. 1 shows a ferroelectric memory cell in accordance with one embodiment of the invention.

Referring to FIG. 1, an illustrative ferroelectric memory cell 100 in accordance with one embodiment of the invention is shown. As shown, the memory cell comprises a transistor 110 formed on a substrate 101 such as a semiconductor wafer. The transistor includes diffusion regions 111 and 112 separated by a channel 113, above which is located a gate 114. A gate oxide (not shown) separates the gate from the channel. The diffusion regions comprise dopants which are p-type or n-type. The type of dopants chosen is dependent upon the type of transistor desired, For example, n-type dopants such as arsenic (As) or phosphorus (P) are used for n-channel devices, and p-type dopants such as boron (B) are used for p-channel devices. Depending on the direction of current flow between the diffusion regions, one is referred to as the "drain" and the other the "source." The terms "drain" and "source" are herein used interchangeably to refer to the diffusion regions. Typically, the current flows from the source to drain. The gate represents a wordline, and one of the diffusion regions is coupled to a bitline 125 by a contact plug 120.

A capacitor 150 is coupled to diffusion region 112 via a contact plug 140. The capacitor comprises bottom and top electrodes 153 and 157 separated by a ferroelectric layer 155. Typically, the electrodes are formed from noble metal such as, for example, Pt. A conductive barrier layer 151 can be provided between the bottom electrode and contact plug. The barrier layer inhibits the diffusion of oxygen into the contact plug 140. The barrier layer also inhibits 1) the diffusion of atoms from the plug into the ferroelectric layer, and 2) the migration of atoms from the bottom electrode or ferroelectric layer into the plug.

In accordance with the invention, the ferroelectric layer is formed from an amorphous as-deposited layer or film. The amorphous film is annealed, transforming it into the ferroelectric layer. We have discovered that by forming the ferroelectric layer from an amorphous layer, a lower thermal budget is consumed by the ferro-anneal as compared to that of ferroelectric layer formed from conventional techniques. The lower thermal budget avoids or reduces excessive diffusion of one or more of the constituents of the ferroelectric layer and oxidation of the contacts.

An interlevel dielectric (ILD) layer 160 is provided to isolate the different components of the memory cell. The ILD layer comprises, for example, silicate glass such as silicon dioxide ($SiO_2$) or silicon nitride ($Si_3N_4$). Doped silicate glass such as borophosphosilicate glass (BPSG), borosilicate glass (BSG), or phosphosilicate glass (PSG) are also useful. Other types of dielectric materials can also be used.

Applying an appropriate voltage to the gate switches the transistor on, enabling current to flow through the channel between the diffusion regions in order to form a connection between the capacitor and bitline. Switching off the transistor severs this connection, thereby preventing current from flowing through the channel.

The memory cell 100 is formed by a process sequence that includes forming the transistor 110 on the substrate. The substrate, for example, is a semiconductor wafer comprising silicon. Other types of substrates such as germanium (Ge), gallium arsenide (GaAs), or other semiconductor compounds are also useful. Typically, the substrate is lightly doped with p-type dopants such as B. More heavily doped substrates are also useful. A heavily doped substrate with a lightly doped epitaxial (epi) layer such as a p−/p+ substrate can also be used. N-type doped substrates, including lightly doped, heavily doped, or heavily doped substrates with a lightly doped epi layer, are also useful.

A doped well comprising dopants having a first electrical type is provided. The doped well is formed by selectively implanting dopants into the substrate in the region where the transistor is formed. A photoresist mask layer can be used for selectively implanting the dopants. The dopant profile is sufficient to prevent punchthrough. In one embodiment, the doped well is formed by implanting p-type dopants such as B into the substrate. The p-type doped well (p-well) serves as a doped well for n-channel devices. The use of an n-type doped well (n-well) comprising, for example, As or P dopants is also useful for p-channel devices.

Diffusion regions 111 and 112 are formed by selectively implanting dopants having a second electrical type into the desired portions of the substrate. A screen oxide is used, for example, to serve as an implant screen to reduce damage to the substrate. In one embodiment, n-type dopants are implanted into the p-type well used for n-channel devices and p-type dopants are used for p-channel devices. After implanting the dopants, the screen oxide is removed. An implant may also be performed to implant dopants into the channel region between the diffusion regions to adjust the gate threshold voltage ($V_T$) of the transistor. Such an implant is referred to as a "$V_T$ adjust implant." Forming the diffusion regions after gate formation is also useful.

Various layers are deposited on the substrate and patterned to form the gate. The gate, for example, include gate oxide and polycrystalline silicon (poly) layers. The poly is, for example, doped with dopants having an electrical type. In some cases, a metal silicide layer is formed over the poly, producing a polysilicon-silicide (polycide) layer to reduce sheet resistance. Various metal suicides, including molybdenum ($MoSi_x$), tantalum ($TaSi_x$), tungsten ($Wsi_x$), titanium silicide ($TiSi_x$) or cobalt silicide ($CoSi_x$), are useful. Aluminum or refractory metals, such as tungsten and molybdenum, can be used alone or in combination with suicides or poly.

Contact plugs 120 and 140 and bitline 125 are formed after completion of the transistor using various known techniques such as, for example single or dual damascene techniques. Reactive ion etch (RIE) techniques are also useful. A combination of damascene and etch techniques can also be used. The contact plugs comprise a conductive material such as doped poly or tungsten (W). Other conductive materials are also useful. The bitline, for example, comprises aluminum (Al) or other types of conductive materials. An ILD layer 160 isolates the different components of the memory cell.

The process continues by forming the ferroelectric capacitor 150. A conductive layer 153 comprising, for example, Pt is deposited over the ILD layer 160. To prevent or reduce migration of atoms between the contact plug 140 and the ferroelectric layer, a conductive barrier layer 151 is provided prior to deposition of the conductive layer. The barrier layer comprises, for example, titanium nitride (TiN). The conductive layer is patterned to form a bottom electrode. Other materials such as $IrSi_xO_y$, $CeO_2/TiSi_2$, or $TaSiN_x$ are also useful. The barrier layer is also patterned along with the metal layer.

An amorphous layer 155 is formed above the electrode. The amorphous layer is processed to produce a ferroelectric layer in accordance with the invention. The amorphous layer comprises materials that can be transformed into a ferroelectric layer. In one embodiment, the amorphous layer comprises a Bi-based oxide ceramic. The Bi-based oxide ceramic comprises, for example, strontium bismuth tantalate (SBT) or a material derived from SBT (SBT derivative). The amorphous layer is annealed under appropriate conditions, transforming it into a ferroelectric layer.

A conductive layer 157 comprising, for example, Pt is deposited over the ferroelectric layer to form the top electrode. Typically, the top electrode is not patterned since it serves as a common electrode, connecting other capacitors in the memory array.

Additional processing is performed to complete the ferroelectric memory IC. Such additional processing is known in the art. For example, the additional processing includes forming support circuitry, contact openings to the bitline, final passivation layer, contact openings in the passivation layer for testing and connecting to lead frame, and packaging.

Figure 2:
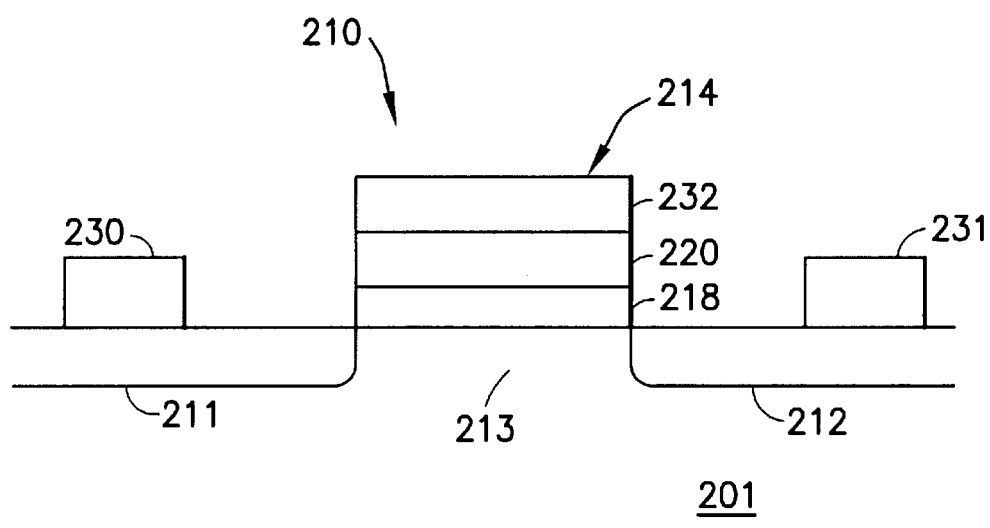
FIG. 2 shows a metal oxide field effect transistor comprising a ferroelectric layer in accordance with one embodiment of the invention.

FIG. 2 shows a field effect transistor (FET) 210 comprising a ferroelectric layer in accordance with one embodiment of the invention. As shown, the transistor 210 is provided on a substrate 201. The substrate, for example, comprises silicon. Other types of substrates such as germanium (Ge), gallium arsenide (GaAs), or other semiconductor compounds are also useful. Typically, the substrate is lightly doped with p-type dopants such as B. More heavily doped substrates are also useful. A heavily doped substrate with a lightly doped epi layer such as a p−/p+ substrate can be used. N-type doped substrates, including lightly doped, heavily doped, or heavily doped with a lightly doped epi layer, are also useful.

A doped well (not shown) can be provided for the transistor. The doped well comprises dopants having a first electrical type, such as p-type. The p-well serves as a doped well for an n-channel transistor. An n-well is also useful for a p-channel transistor. The doped well comprises a desired dopant profile to prevent punchthrough.

The transistor includes diffusion regions 211 and 212 separated by a channel 213, above which is located a gate 214. The diffusion regions comprise dopants having a second electrical type. In one embodiment, the diffusion regions comprise n-type dopants, such as As or P, to form the n-channel transistor. P-type dopants such as B are used for a p-channel transistor.

A high epsilon dielectric 218 serves as a gate dielectric layer. The high epsilon dielectric layer also serves as a barrier layer that inhibits mobile atoms from a ferroelectric layer 220 into the substrate. The high epsilon dielectric layer comprises, for example, $CeO_2$, $ZrO_2$, $Ta_2O_5$, $Y_2O_3$, or $Hf_2O_5$. Over the gate dielectric is the ferroelectric layer 220. In accordance with the invention, the ferroelectric layer is formed from an amorphous layer. The amorphous layer comprises a metal oxide ceramic material that can be transformed into a ferroelectric layer. In one embodiment, the amorphous layer comprises a Bi-based oxide ceramic. The Bi-based oxide ceramic comprises, for example, SBT or an SBT derivative. Such a configuration enables the electrical polarization of the ferroelectric layer to influence the source drain junction (channel 213).

A gate electrode 232 is coupled to the ferroelectric layer. The gate electrode comprises a conductive material which does not react with the ferroelectric layer. In one embodiment, the gate electrode comprises Pt. Materials such as noble metals or other materials which do not react with the ferroelectric layer are also useful. Electrodes 230 and 231 are coupled to diffusion regions 211 and 212, respectively. Electrodes 230 and 231 comprise conductive material. As electrodes 230 and 231 do not contact the ferroelectric layer, they need not be formed from the same material as electrode 232. However, the same material used to form electrode 232 can be used to form electrodes 230 and 231 in order to simplify processing.

The transistor is formed by a process sequence that includes providing a substrate having, for example, a doped well comprising dopants of the opposite electrical type as that of the diffusion regions of the transistor. In one embodiment, the substrate comprises an n-/n+ substrate with a p-type well in the region in which the transistor is formed. Other types of substrates are also useful. Isolation regions such as field oxides or shallow trench isolations are formed to isolate the transistor from other devices.

A gate threshold ($V_\tau$) adjust implant can be performed to achieve the desired gate threshold voltage. This includes forming an oxide over the substrate to serve as a screen oxide for the ion implantation process. Dopants are then implanted into the substrate. Since the isolation regions serve as an implant mask, dopants are implanted in the source/drain regions of the transistor. Subsequently, the screen oxide is removed.

The high epsilon dielectric layer serving as the gate dielectric is formed over the substrate. An amorphous metal oxide ceramic layer capable of being transformed into a ferroelectric layer is deposited over the gate dielectric. The amorphous layer is transformed into a ferroelectric layer by a ferro-anneal. A cap oxide layer can be optionally formed over the ferroelectric layer to serve, for example, as an etch stop for subsequent processing.

The various deposited layers are patterned to form the gate of the transistor. After the gate is formed, dopants are implanted into the substrate. The gate and isolation regions together serve as an implant mask, creating self-aligned diffusion regions. Oxide spacers can be formed on the sidewalls of the gate prior to the implant to form lightly doped diffusion regions.

An ILD layer is formed over the transistor. Contact openings are formed and filled with conductive material to form contacts to the gate and diffusion regions. Other process flows for forming the transistor are also useful.

Figure 3:
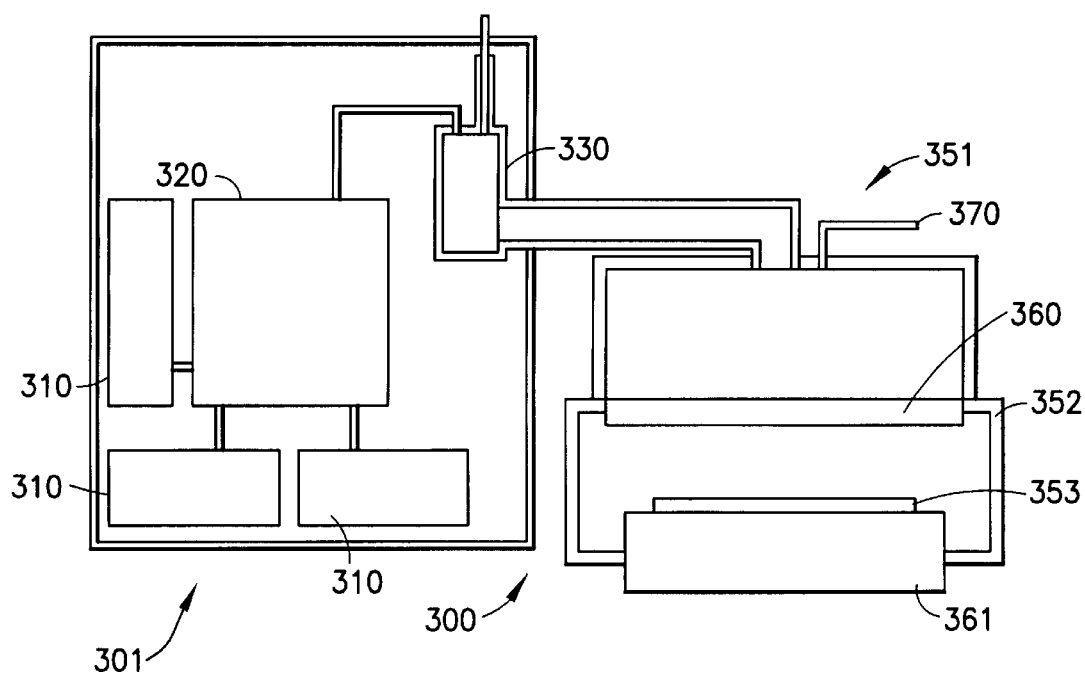
FIG. 3 shows a system for fabricating a ferroelectric layer in accordance with one embodiment of the invention.

FIG. 3 shows an illustrative system 300 employed to form the ferroelectric material on the substrate. The system comprises delivery 301 and reactor 351 subsystems. The delivery subsystem, for example, comprises a liquid delivery system such as an LDS-300 provided by Advanced Technology Materials, Incorporated (ATMI), which is located in Danbury, Conn. Other types of delivery subsystems are also useful. Such delivery subsystems include those provided by, for example, Applied Materials, Incorporated, which is located in Santa Clara, Calif. As shown, the delivery subsystem comprises a plurality of reservoirs 310. The reservoirs are used to store precursors used in the formation of the ferroelectric material. In one embodiment, an individual precursor is stored in a reservoir. Storing the precursors in a single reservoir or a mixture of precursors in one or more reservoirs is also useful. Also, storing a mixture of precursors in one or more reservoirs in combination with storing an individual precursor in a reservoir is useful. Typically, the precursors are stored in a solution.

Coupled to the reservoirs is a mixing pump 320. The mixing pump controls the amount of precursors delivered from the reservoirs into the mixing pump and mixes the precursors to form a solution having the desired ratio. Controlling the amount of precursors is achieved by, for example, adjusting the pump speed.

The pump delivers the mixed solution to a vaporizer 330 coupled thereto. The vaporizer, for example, is a flash vaporizer. A description of a flash vaporizer is provided in, for example, U.S. Pat. No. 5,204,314, U.S. Pat. No. 5,536,323, U.S. Pat. No. 5,77,002, and U.S. Pat. No. 5,711,816, which are herein incorporated by reference for all purposes. The vaporizer includes, for example, a hot matrix structure that is used to evaporate the solution to produce precursor vapors. A carrier gas source is coupled to the vaporizer to facilitate delivery of the vapors to the reactor subsystem. Alternative techniques for precursor evaporation and delivery are also useful. For example, a bubbler can be used to evaporate solid precursors to form precursor vapors. Also, nebulization systems that generate a mist or spray of precursor droplets that are evaporated to form vapors are useful. The precursor vapors are mixed and delivered to the reactor.

The reactor subsystem 351 comprises, for example, a chemical vapor deposition (CVD) reactor. The CVD reactor, in one embodiment, is a High K CVD system from Novellus Systems, Incorporated, which is located in San Jose, Calif. Other CVD reactors are also useful. The CVD reactor comprises a reaction chamber 352.

A susceptor 361 for supporting a substrate 353 is provided in the reaction chamber. Illustratively, the susceptor supports one subs-rate, Other types of susceptors which support more than one substrate are also useful. The susceptor can be stationary or rotated during deposition. Also, the substrate can be rotated by the susceptor, such as in a planetary type reactor. A susceptor that rotates the substrate or substrates and is rotated itself is also useful.

An injector 360 is provided to introduce precursors and reactive gases into the reaction chamber. As shown, the injector is a showerhead type injector such as those described in, for example, U.S. Pat. No. 5,653,806 and U.S. Pat. No. 5,741,363, which are herein incorporated by reference for all purposes. Other types of injectors are also useful. Alternatively, a plurality of injectors can be provided to introduce precursors into the reaction chamber. The substrate is orientated such that the injector introduces precursors in a perpendicular direction to a major surface of substrate. Other substrate orientations, such as flowing precursors in a direction parallel to the major surface, are also useful.

The vaporizer from the delivery subsystem is coupled to the injector. Inlet or inlets 370 are provided for the injector for coupling other sources, as appropriate, thereto. In one embodiment, makeup gas such as Ar, $N_2$, or He and/or an oxidizer such as $O_2$, $N_2O$, or $O_3$ are mixed with the precursor vapors and introduced into the reaction chamber via the injector. The vapor mixture flows onto the substrate and reacts under appropriate process conditions, forming an amorphous film on the substrate surface. Temperature and pressure controllers are provided to ensure that the reaction is performed under desired conditions, The reaction temperature is controlled by, for example, heating the susceptor in order to heat the substrate.

In accordance with the invention, a metal oxide ceramic material or film is deposited in amorphous form. In one embodiment, the metal oxide ceramic is subsequently processed to form a ferroelectric material. The amorphous material or film is deposited in a CVD system such as that described in FIG. 3.

The substrate may be processed to include, for example, a gate oxide of a ferroelectric transistor. In other cases, the substrate may be processed to include a bottom electrode of a ferroelectric capacitor that has been patterned on an ILD. Additional circuit components of an IC, such as transistors, may also be included.

The bottom electrode comprises a conductive material that does not react with the subsequently deposited metal oxide ceramic film in its amorphous or ferroelectric form. In one embodiment, the bottom electrode comprises a noble metal such as Pt, Pd, Au, Ir, or Rh. Other materials such as conducting metal oxides, conducting metal nitrides, or super conducting oxides which do not react with the ferroelectric layer are also useful. Conducting oxides include, for example, $IrO_x$, $RhO_x$, $RuO_x$, $OsO_x$, $ReO_x$, or $WO_x$ (where x is greater than about 0 and less than about 2). Conducting metal nitrides include, for example, $TiN_x$, $ZrN_x$ (where x is greater than about 0 and less than about 1.1), $WN_x$, or $TaN_x$ (where x is greater than about 0 and less than about 1.7). Super conducting oxides can include, for example, $YBa_2Cu_2O_{7-x}$ or $Bi_2Sr_2Ca_2Cu_2O_{10}$.

The substrate is placed on the susceptor in the reaction chamber and heated to the deposition temperature. The reaction chamber is flushed with, for example, a mixture of inert gas and an oxidizer. Precursor vapors are mixed with a carrier gas and delivered into the reaction chamber. The precursor vapor mixture can also be mixed with a make-up gas and/or an oxidizer in order to adjust concentration of the precursors and the flow rate of the gases into the chamber to desired levels. The substrate is exposed to the precursor vapor mixture under appropriate process conditions to deposit a substantially amorphous film.

The amorphous film comprises a material which can be processed, for example by a ferro-anneal, to form a ferroelectric film. In one embodiment, the amorphous layer comprises a metal oxide ceramic material. Preferably, the amorphous layer comprises a Bi-based oxide ceramic material. More preferably, the amorphous layer comprises a Bi-based oxide ceramic material that can be processed to transform it into a ferroelectric.

The ferroelectric structure of the Bi-based oxide ceramic often comprises an Aurivillius phase having a layered perovskite structure. The perovskite structure comprises 2-dimensional perovskite layers that are separated in the third dimension by layers with a different structure, forming a stack of layers with alternating perovskite and non-perovskite layers. The Aurivillius phase of different types of Bi-based oxide ceramics may have different numbers of layers in the perovskite structure. Other types of materials which are ferroelectric can also comprise a layered perovskite structure.

The Aurivillius phase of the Bi-based oxide ceramic, in one embodiment of the invention, comprises negatively charged perovskite layers separated by positively charged Bi oxide layers. The Bi-based oxide ceramic is expressed by the general formula:

$$(Bi_2O_2)^{2+}(A_{m-1}B_mO_{3m+1})^{2-}$$

where $A=Bi^{3+}$, $L^{3+}$, $L^{2+}$, $Ca^{2+}$, $Sr^{2+}$, $Ba^{2+}$, $Pb^{2+}$, and $Na^+$; $B=Fe^{3+}$, $Al^{3+}$, $Sc^{3+}$, $Y^{3+}$, $L^{3+}$, $L^{4+}$, $Ti^{4+}$, $Nb^{5+}$, $Ta^{5+}$, $W^{5+}$, and $Mo^{6+}$; and m=1, 2, 3, 4, 5. L=a metal from the lanthanide series which includes, for example, Ce, La, Pr, Ho, Eu, and Yb.

In one embodiment, the Bi-based oxide ceramic comprises Ta. In another embodiment, the Bi-based oxide ceramic comprises Sr. Preferably, the Bi-based oxide ceramic comprises Sr and Ta. More preferably, the Bi-based oxide ceramic comprises strontium bismuth tantalate (SBT). In alternative embodiments, the Bi-based oxide ceramic comprises Ti or Ti and Sr. A Bi-based oxide ceramic comprising Sr and Nb or Sr, Ta, and Nb is also useful.

The SBT is expressed by, for example, the formula $SrBi_2Ta_2O_9$. The Aurivillius phase of the SBT film comprises negatively charged perovskite layers of Sr and Ti oxide separated by positively charged Bi oxide layers. The stoichiometry of the Sr and Ti oxide is for example $[SrTa_2O_7]^{2n-}{}_n$, and the stoichioometry of the Bi oxide layers is for example $[Bi_2O_2]^{2n+}{}_n$, creating a structure of alternating $[SrTa_2O_7]^{2n-}{}_n$ and $[Bi_2O_2]^{2n+}{}_n$ layers.

In another embodiment, the Bi-based oxide ceramic comprises an SBT derivative. The SBT derivative is formed by, for example, substituting one or more of the metallic elements with other metallic elements having the same oxidation states. For instance, Ta can be replaced by Nb, and Sr can be replaced by Ba, Ca, or Pb, resulting in a compound expressed by the generic formula $XBi_2Z_2O_9$, where X=Srt Ba, Ca, or Pb and Z=Ta or Nb.

In one embodiment, the SBT derivative comprises Bi and Ta. In another embodiment, the SBT derivative comprises Bi and Sr. In yet another embodiment, the SBT derivative comprises Di, Sr, and Ta- The SBT derivative comprises, for example, $SrBi_2Ta_{2-x}Nb_xO_9$ (0<x<2), $SrBi_2Nb_2O_9$, $Sr_{1-x}Ba_xBi_2Ta_{2-y}Nb_yO_0$ (0≤x≤1, 0≤y≤2), $Sr_{1-x}Ca_xBi_2Ta_{2-y}Nb_yO_9$ (0≤x≤1, 0≤y≤2), $Sr_{1-x}Pb_xBi_2Ta_{2-y}Nb_yO_9$ (2≤x≤1, 0≤y≤2), or $Sr_aBa_bCa_cPb_{1-a-b-c}Bi_2Ta_xNb_{2-x}O_9$ (0≤a+b+c≤1, 0≤x≤2).

Precursors and reactive gases for forming a Bi-based oxide ceramic are described in co-pending U.S. patent application Ser. No. 08/975,087, titled "Low Temperature CVD Process using B-Diketonate Bismuth Precursor for the Preparation of Bismuth Ceramic Thin Films for Integration into Ferroelectric Memory Devices," which was filed on Nov. 20, 1997; and co-pending U.S. patent application Ser. No. 08/960,915, titled "Anhydrous Mononuclear Tris(Beta-Diketonate) Bismuth Compositions and Method of Making the Same," which was filed on Oct. 30, 1997, and which are both herein incorporated by reference for all purposes.

In one embodiment, the Bi precursor of the Bi-based oxide ceramic comprises Bi($\beta$-diketonate). Preferably, the Bi precursor comprises Bi(thd)$_3$. Bi alcoxides, Bi carboxylates, Bi amides, and Bi aryls are also useful Bi precursors. In one embodiment, the Bi aryl precursor comprises BiPh$_3$. The BiPh$_3$ can be, for example, physically activated by a plasma.

The Sr precursor of the Bi-based oxide ceramic comprises, for example, Sr($\beta$-diketonate). In one embodiment, the Sr precursor comprises Sr(thd)$_2$. Sr(thd)$_2$ (adduct) such as Sr(thd)$_2$ (pentamethyldiethylenetriamine) or Sr(thd)$_2$(tetraglyme) is especially useful.

The Ta precursor of the Bi-based oxide ceramic comprises, for example, Ta($\beta$-diketonate). Ta alcoxides are especially useful Ta precursors. In one embodiment, the Ta precursor comprises Ta($\beta$-diketonate) alcoxides such as Ta(thd)$_x$(OR)$_{5-x}$. A Ta precursor such as Ta(thd)(O:Pr)$_4$ is also useful.

In another embodiment, the SBT or SBT-derived film is formed with Bi(thd)$_3$, Sr(thd)$_2$ pentamethyldiethylenetriamine adduct, and Ta(OiPr)$_4$(thd) precursors.

In an illustrative embodiment, individual precursors are dissolved in a solvent system and stored in a respective reservoir of the delivery subsystem. Mixing the precursors in a single reservoir is also useful. The precursors should be highly soluble in the solvent system. The solubility of the precursors in the solvent system is, for example, about 0.1–5M, preferably about 0.1–2M, and more preferably about 0.1–1M.

The solvent solution should be stable, preventing the precursors from either interacting with the solvents or with other precursors. The solvent solution should preferably be stable over a sufficiently long period of time, typically about 6–12 months, to permit shipment and storage. Additionally, the solvent solution should preferably remain stable at vaporization temperatures.

In one embodiment, the solvent system comprises an alkane solvent system of low polarity. The alkane solvent system has been found to be effective when employing a delivery subsystem with a vaporizer such as that provided by ATMI. Alkane solvents are described in, for example, co-pending U.S. patent application Ser. No. 08/975,372, titled "Method for Forming Metal Films on a Substrate by Chemical Vapor Deposition," which is herein incorporated by reference for all purposes.

In one embodiment, the alkane solvent system comprises octane/decane/pentamethyldiethylenetriamine. The ratio of the octane/decane/pentamethyldiethylenetriamine solution by volume is, for example, 5:4:1. Other ratios are also useful. The molar concentration of the precursors in the solution is sufficient to achieve a desired growth rate of the deposited amorphous film. Other solvent systems are also useful. For example, solvent systems comprising THF/iPrOH/tetraglyme in a ratio of, for example, about 8:2:1 by volume has also been found useful.

The precursor solutions are evaporated, and the vapors are delivered to the reaction chamber. In one embodiment, the individual precursor solutions are mixed together by the mixing pump to produce a solution of precursors. A mixture of the precursors in a single reservoir or a combination of a precursor mixture in a reservoir along with an individual precursor in a reservoir is also useful. The mixed precursor solution is delivered to the vaporizer and evaporated to produce precursor vapors. The amount of vapors produced depends on the molar concentration of the precursors and the liquid delivery rate of the mixing pump. In one embodiment, the amount of vapors produced is sufficient to achieve a desired growth rate of the deposited Bi-based oxide ceramic film.

The vapors are delivered to the reactor subsystem, To facilitate delivery of the vapors, a carrier gas is employed. The carrier gas, for example, comprises an inert gas such as Ar, He, or N$_2$. Other inert gases are also useful. The carrier gas is provided to the vaporizer, delivering the precursor vapors to the injector of the reactor subsystem. The vapors can be further mixed with an inert gas and/or an oxidizer such as O$_2$. The inert gas serves as, for example, a make-up gas. For a particular injector and reactor system, the flow rate of the gas or gases can be optimized to produce a film with the desired characteristics, such as growth rate, uniformity, and texture.

In one embodiment, the flow rate of the carrier gas is about 50–10000 sccm and preferably about 200–500 sccm. The flow rate of Ar is about 100–10000 sccm and preferably about 500–5000 sccm. The flow rate of the O$_2$ is about 100–10000 sccm and preferably 500–5000 sccm. The O$_2$/Ar ratio is about 5–100%, preferably 40–70%. Of course, other flow rates are useful and can be optimized for a specific system. Additional oxidizers such as, for example, N$_2$O, NO, NO$_2$, or O$_3$ can be mixed with the vapors. The vapor mixture is introduced into the reaction chamber via the injector, such as a showerhead injector. The total flow rate of the gases is, for example, about 300–20,000 sccm. Other total flow rates such as about 800–10,000 sccm, about 1,000–5,000 sccm, or about 1,000–2,000 sccm are also useful.

The precursors react under the desired process conditions, depositing a Bi-based oxide ceramic film on the substrate. In accordance with the invention, the Bi-based oxide ceramic film is deposited substantially in amorphous form, without substantially any fluorite phase present. In one embodiment, the as-deposited film is amorphous as determined by x-ray diffraction (XRD). A D/maxB XRD system manufactured by Rigaku was used. The system was set up with a graphite curved crystal monochrometer and a Cu X-ray target. The divergent slit was 1°, the receiving slit for the goiniometer was 0.15° and the receiving slit for the monochrometer was 0.6°. Intensity was measured continuously and recorded at 0.02° increments in 2$\theta$.

Depositing an amorphous Bi-based oxide ceramic film without substantially any fluorite phase contradicts conventional wisdom, which suggests that the fluorite phase is crucial as an intermediate phase from which the deposited film is transformed into a ferroelectric. See for example Isobe et al., Integrated Ferroelectrics, 1997, Vol. 14, pp. 95–103. There are several reasons why the fluorite phase is believed to be important. It is believed that the fluorite phase serves to transport the as-deposited film up to the reaction temperatures required for the perovskite formation without phase separation, e.g., to prevent separation of the oxides during annealing. Additionally, the pre-arrangement of the atoms in a fluorite phase may facilitate a fast film transformation to the Aurivillius phase.

We have discovered that depositing an amorphous Bi-based oxide ceramic film without substantially any fluorite phase is advantageous. For example, the amorphous film requires a lower thermal budget than conventional as-deposited films to transform it into the ferroelectric phase. Furthermore, ferroelectrics formed from amorphous films have better electrical characteristics than those formed from conventional techniques.

Bi-based oxide ceramics deposited by conventional techniques were analyzed with various techniques, which include transmission electron microscopy (TEM), scanning electron microscopy (SEM), energy dispersive x-ray spectroscopy (EDS), and atomic force microscopy (AFM). The analysis shows that the fluorite phase correlates with relatively larger features or bumps comprising more Bi atoms in comparison to the amorphous regions of the film. This indicates that Bi atoms segregate to the non-amorphous parts of the film during deposition. The Bi-rich features are associated with leakage in capacitors, decreasing yield. However, a small amount of fluorite phase may be acceptable, depending on yield requirements.

In contrast to the conventional as-deposited films, the substantially amorphous as-deposited films is relatively smooth with smaller or no features. The relatively smooth surface indicates that there is reduced Bi segregation during deposition, which produces a film that is more homogeneous in composition than conventional as-deposited films with fluorite phase. The surface morphology of XRD amorphous films is smooth with no or almost no features, indicating that the film is homogeneous in composition.

The amorphous nature of the Bi-based oxide ceramic film is affected by the deposition temperature. The Bi-based oxide ceramic is deposited at a temperature which produces a substantially amorphous film. In one embodiment, the deposition temperature is less than about 430° C., preferably at about 280–430° C., more preferably at about 280–410° C., more preferably at about 330–400° C., more preferably at about 330–390° C., more preferably at about 350–390° C., more preferably at about 360–380° C., and more preferably at about 380° C. At temperatures less than 430° C., a substantially amorphous film is produced. It has been found, in one embodiment, that an XRD amorphous film is produced when deposited at temperatures of about 380° C. or less.

In some embodiments, temperatures greater than 430° C. are also useful. Temperatures of, for example, equal to or less than about 450° C. can be useful. In one embodiment, the deposition temperature is about 330–450° C. A deposition temperature of about 330–435° C. can also be useful.

The deposition pressure of the reactor has also been found to affect the amorphous nature of the deposited film. In one embodiment, the pressure at which the film is deposited produces a substantially amorphous film. The deposition pressure, for example, is about 0.1–760 torr, preferably greater than about 1 torr, more preferably about 1–20 torr, more preferably about 3–20 torr, more preferably about 5–20 torr, more preferably 7–20 torr, more preferably about 7–12 torr, and more preferably 8–10 torr. As the deposition pressure increases, formation of fluorite phase decreases. Furthermore, higher deposition pressures can, in some cases, enable the use of higher deposition temperatures with reduced or no fluorite phase formation.

The growth rate has also been found to have some effect on the amorphous nature of the as-deposited film. The growth rate of the as-deposited film, in one embodiment, is sufficiently high to produce a substantially amorphous film. In one embodiment, the growth rate is greater than about 2 nm/min, preferably about 2–20 nm/min, more preferably about 4–20 nm/min, more preferably about 5–20 nm/min, and more preferably about 5–10 nm/min. Higher growth rates, in some cases, seem to suppress the formation of fluorite phase.

The as-deposited film's growth rate depends on various factors, including the liquid delivery rate of the precursor solutions into the vaporizer, molar concentration of the precursor solution, and reactor geometry. For a reactor such as the one described in FIG. 3, the liquid delivery rate is, for example, greater than 0.1 ml/min, preferably greater than 0.2 ml/min. In forming an SBT film, the molar concentration of Bi and Ta is about 0.0005–0.8M, and the molar concentration of Sr is about 0.005–0.2M. Preferably the molar concentration of Bi and Ta is about 0.05–0.3M and Sr is about 0.02–0.15M.

The roughness of the bottom electrode appears to affect the amount of the fluorite phase formation in the deposited Bi-based oxide ceramic film. A rough surface seems to increase the amount of fluorite phase in the film. It is believed that the rough surface provides nucleation sites for fluorite formation. Providing a bottom electrode with a relatively smooth surface reduces or eliminates nucleation sites available for fluorite formation.

An electrode with a relatively smooth surface can be formed by depositing the electrode under conditions that result in little or no stress at the deposition temperature of the Bi-based oxide ceramic. Stress is related to the deposition temperatures of the electrode and the Bi-based oxide ceramic. The electrode is deposited at a temperature which produces either no stress or moderately tensile stress at the deposition temperature of the Bi-based oxide ceramic layer. Typically, the lower the deposition temperature, the lower the stress. In one embodiment, a bottom electrode comprising Pt is deposited at a temperature of about 150–250° C., preferably about 170–220° C., and more preferably about 190° C.

Hillock formation in the electrode can increase the surface roughness. Typically, hillocks are formed during pre-deposition annealing of the substrate. To avoid or reduce hillock formation, the pre-deposition anneal should be optimized. For example, the pre-deposition anneal can be optimized by varying the temperature, ambient, and/or duration of the anneal.

Also, the stoichiometry or composition of the Bi-based oxide ceramic affects the amorphous nature of the film. For Bi-based oxide films comprising Ta, the ratio of Bi/Ta affects the amorphous nature of the film. In one embodiment, the Bi/2Ta ratio is less than about 2–8, preferably about 1.9–2.8, about 1.9–2.5, about 1.9–2.3, about 1.9–2.2, and about 1.9–2.1. For Bi-based oxide films comprising Sr and Ta, the ratio of Sr/Ta affects the amorphous nature of the film. In one embodiment, the Sr/2Ta ratio is about 0.5–1.1, preferably about 0.5–0.9, about C.65–0.8, and about 0.7–0.8.

It is believed that, in general, Bi segregation and fluorite nucleation depend on the mobility of the Bi species of the Bi-based oxide ceramic layer (e.g., $Bi_2O_3$) on the hot substrate or film surface. It is believed that higher temperatures, lower growth rates, lower $O_2$ concentrations, and lower reactor pressures tend to increase the mobility of the Bi species. On the other hand, it is believed that high Bi contents in the film and a rough bottom electrode facilitate the nucleation of fluorite and growth of Bi-rich protrusions.

After the amorphous film is deposited, the precursor and reactant gases are turned off. The chamber is flushed with a mixture of an inert gas and an oxidizer to prepare for the removal of the substrate. The substrate is removed from the reaction chamber and post processed with a ferro-anneal to transform the amorphous film into a ferroelectric. The substrate can be cooled to a desired temperature, if appropriate or necessary, prior to post processing. Cooling the substrate prior to its removal from the reaction chamber is also useful. An in-situ post processing of the amorphous film in, for example, a cluster tool is also useful.

The ferro-anneal is performed in, for example, an oxidizing ambient comprising $O_2$. Other oxidizing ambients are also useful. Post processing of the amorphous film to transform it into a ferroelectric phase is more efficient compared to post processing of conventional as-deposited films containing the fluorite phase. As a result, the thermal budget needed to convert the amorphous film into the ferroelectric structure is lower than that needed for fluorite-containing films.

The ferro-anneal transforms the amorphous film into a ferroelectric. A ferro-anneal at a temperature of about 600–830° C. for about 1–60 minutes, depending on the temperature, has been found to be sufficient to convert the amorphously deposited film to the ferroelectric Aurivillius phase. The higher the temperature of the anneal, the shorter the time required to transform the substantially amorphous film to the Aurivillius ferroelectric phase. For example, an anneal of about 5 minutes at 750° C. is sufficient to complete the transformation to the Aurivillius phase. A slightly longer anneal of about 10 minutes is sufficient to complete the transformation to the Aurivillius phase at about 700° C.

The remanent polarization ($2P_r$) has been found to increase rapidly with annealing time. For example, an anneal at 800° C. yielded a $2P_r$ value of 8.5 $\mu C/cm^2$ after 2.5 minutes and 12.5 $\mu C/cm^2$ after 5 minutes. At 730° C. after 10 minutes, a $2P_r$ value of 8.9 $\mu C/cm^2$ was measured. The anneal times and temperatures, of course, can be optimized to achieve the desired electrical characteristics for a given thermal budget.

In an alternative embodiment, a multi-step anneal is employed in the post processing of the amorphous film. The multi-step anneal comprises, for example, a relatively short anneal at a high temperature to form nuclei of the ferroelectric structure followed by a longer lower temperature anneal to convert the as-deposited film to the ferroelectric structure. Once the nuclei are formed, the film can be transformed into the ferroelectric structure at a lower temperature. Multiple anneals at lower temperatures can also be used after formation of the nuclei. Thus, the multi-step anneal has been found to be advantageous as it further reduces the thermal budget required to transform the substantially amorphous film to the ferroelectric structure.

In one embodiment, the anneal to form the nuclei comprises, for example, a rapid thermal anneal (RTA). An RTA at about 750–800° C. for less than about 2 min has been found to be sufficient to form ferroelectric nuclei in the as-deposited Bi-based oxide ceramic film. The film is annealed at a lower temperature for a longer period of time to grow the ferroelectric phase. In one embodiment, the anneal is performed at a temperature of less than about 670° C. for about 60 min.

It is believed that the reason a lower thermal budget is needed to transform the amorphous precursor film into the ferroelectric phase is because amorphous films are more compositionally homogeneous than the fluorite-containing as-deposited films. Heterogeneous films such as the fluorite-containing films require more time and higher temperature anneals because some atoms in these films have to move over longer distances. Other detrimental phases might be formed during the longer high temperature anneals in parts of the films with the wrong composition.

After post processing to transform the as-deposited film into a ferroelectric film, processing continues to form, for example, the ferroelectric memory cell.

Depositing other types of metal oxide ceramic films amorphously is also useful. For example, Lead-based oxide ceramics, such as lead zirconium titanate (PZT), are also useful. Also amorphous films that form ferroelectric films such as lithium niobium oxide ($LiNbO_3$) are also useful.

Depositing amorphous metal oxide ceramic films that are not ferroelectric is also useful. In one embodiment, a metal ceramic oxide superconductor layer is formed from a substantially amorphous film deposited on a substrate. In one embodiment, the superconductor layer comprises a Bi-based high temperature superconductor layer. Bi-based high temperature superconductor layers are referred to, for example, as "BSCCO" or "bissco." BSCCO are described in, for example, Rees, "CVD or Nonmetals" (1996) ISBN 3-527-29295-0, which is/are herein incorporated by reference for all purposes. Typical compositions of BSCCO include, for example, $Bi_2Sr_2CaCu_2O_x$ or $(Pb,Bi)_2Sr_2Ca_2Cu_3O_x$. Other compositions of BSCCO include, for example, $Bi_2Sr_2CuO_x$ and $Bi_2Sr_2Ca_3Cu_4O_x$. The phase of the BSCCO, which is similar to the ferroelectric phase of Bi-based oxide ceramics, comprises Bi oxide layers that are interleaved with layers of an ordered metal oxide. The as-deposited amorphous film is transformed into a BSCCO by an anneal. The amorphous BSCCO films, for example, can be deposited and post processed similarly to the Bi-based oxide ceramics.

Experiments

Bi-based oxide ceramic films comprising Sr and Ta were deposited on a silicon substrate. The substrate was processed to include a 635 nm thick silicon oxide. Above the silicon oxide is a 10 mm thick Ti adhesion layer and a 100 nm thick Pt layer. $Sr(thd)_2(pmdeta)$, $Bi(thd)_3$, and $Ta(thd)(O:Pr)_4$ precursors were used, The precursors were stored in solutions of a single metal/organic specie in a solvent comprising octane/decane/pmdeta in a 5:4:1 ratio by volume. The concentration of $Sr(thd)_2(pmdeta)$ was 0.15M, $Bi(thd)_3$ was 0.3M, and $Ta(thd)(O:Pr)_4$ was 0.3M. Ar and $O_2$ were mixed with precursor vapors in a 4:6 ratio per volume, The as-deposited film comprises a Bi/2Ta ratio of about 1.8–2.2 and a Sr/2Ta ratio of about 0.8–1.0.

The films were deposited under 5 different conditions of temperature, liquid delivery rate, and total gas flow, as listed in Table 1. Pressure was varied for the different conditions. The as-deposited films were analyzed to determine the film's thickness, composition, surface morphology, phase content, and Bi loss into the substrate during deposition. X-ray fluorescence (XRF) analysis was used to determine the thickness and composition of the films. Surface morphology was analyzed using SEM, AFM, and TEM. XRD and TEM were used to analyze the phase content of the as-deposited film. The surface morphology and XRD intensity of the fluorite phase of the as-deposited films are listed in Table 2.

TABLE 1

| Dep. Cond. | T [° C.] | Liquid delivery rate [ml/min] | Total gas flow [slm] |
|---|---|---|---|
| #1 | 430 | 0.1 | 10 |
| #2 | 430 | 0.2 | 1.6 |
| #3 | 380 | 0.1 | 1.6 |
| #4 | 380 | 0.2 | 10 |
| #5 | 380 | 0.2 | 1.6 |

TABLE 2

| Film # | Press. [torr] | Dep. Cond. | Dep. Rate [nm/Min] | Morphology (SEM) | Fluorite (111) |
|---|---|---|---|---|---|
| 1 | 3 | #1 | 3.1 | Islands | 90000 |
| 2 | 3 | #2 | 7.7 | Bumps | 6500 |
| 3 | 3 | #3 | 3.4 | Bumps | 1100 |
| 4 | 3 | #4 | 4.2 | Smaller bumps | 400–700 |
| 5 | 3 | #5 | 5.8 | Smaller bumps | 800–2200 |
| 6 | 5 | #1 | 3.1 | Bumps in High density | 60000 |
| 7 | 5 | #2 | 6.2 | Bumps | 20000 |
| 8 | 5 | #3 | 3.5 | Some bumps | 800 |
| 9 | 5 | #4 | 5.1 | Fewer smaller Bumps | 0–1300 |
| 10 | 5 | #5 | 6.5 | Fewer smaller Bumps | 0 |
| 11 | 7 | #5 | 6.0 | Smooth | 0 |
| 12 | 9 | #1 | 2.8 | Bumps in High density | 40000 |
| 13 | 9 | #2 | 3.1 | Bumps | 5500 |
| 14 | 9 | #3 | 2.7 | Small bumps | 1400 |
| 15 | 9 | #4 | 4.7 | Smooth | 0 |
| 16 | 9 | #5 | 4.2 | Smooth | 0 |

XRD spectra of the as-deposited films formed by conditions 1–3 show peaks that can be correlated to a fluorite structure. Also, Bi rich features like bumps or islands were present, indicating Bi segregation. From Table 2, the intensity and size of the features decrease with decreasing deposition temperatures. A decrease in intensity and size of the features correlates with a decrease in Bi segregation. The intensity and size of the features decrease also with increasing deposition pressure as indicated by, for example, a comparison of films 1 and 6. The intensity and size of the features also decrease with increasing growth rates as indicated by, for example, a comparison of films 1 and 2.

Figure 4:
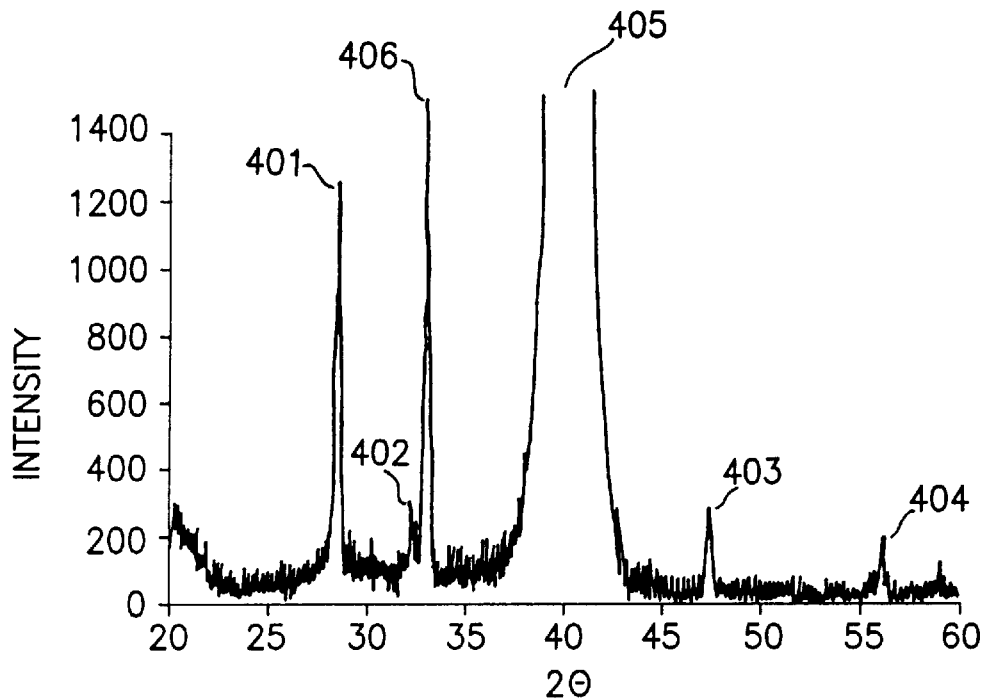
FIG. 4 shows a spectrum of an as-deposited film comprising fluorite phase.

FIG. 4 shows an XRD spectrum of film 14. The spectrum plots the intensity of the fluorite phase against the angle of diffraction (2θ). As shown, the spectrum includes peaks 401–404 which correspond to the fluorite phase. Peak 405 corresponds to the Pt electrode, and peak 406 corresponds to the Si substrate.

The analysis of film 9 shows an almost smooth film with little fluorite phase formation. Increasing the deposition pressure to 9 torr results in a smooth XRD amorphous film with no fluorite phase, as indicted by film 15. Also, depositing a film under the condition of film 10, 11, or 16 produces a smooth XRD amorphous film with no fluorite phase.

Figure 5:
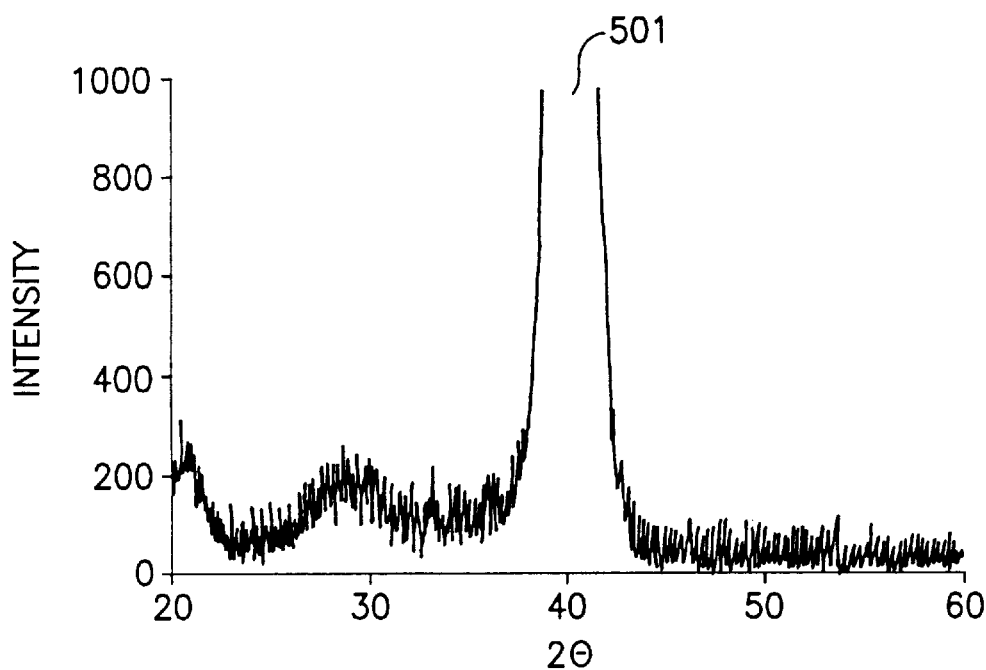
FIG. 5 shows a spectrum of an amorphously deposited film in accordance with one embodiment of the invention.

FIG. 5 shows an XRD spectrum of film 15. The spectrum plots the intensity of the fluorite phase against the angle of diffraction (2θ). The spectra does not include any fluorite peaks corresponding to the fluorite phase, indicating an XRD amorphous film. Peak 501 corresponds to Pt electrode.

The as-deposited films were post processed. A sample was annealed at about 750° C. for about 1 hour in an $O_2$ ambient of about 2.5 slm. Another sample was annealed at about 800° C. for about 1 hour in an $O_2$ ambient of about 2.5 slm. After annealing, a top electrode comprising Pt was deposited over the films followed by an anneal at 700° C. in an $O_2$ ambient of about 2.5 slm. for about 15 minutes. Electrical properties of the annealed films were analyzed using a Radiant Technology RT6000 to determine the remanent polarization. Additionally, the films' surface morphology and Bi loss into the substrate during the anneal was analyzed.

A TEM analysis of films with a fluorite phase after annealing shows that the films comprise bump-like hillocks with a void underneath. It is believed that the bump-like hillocks correspond to Bi rich features before annealing. Bi atoms from the Bi rich features rapidly migrate during anneal to the Bi deficient parts of the film, forming voids underneath where the Bi features were located.

An electrical analysis of the SBT films with fluorite phase often shows high $2P_r$ values. However, the voids can cause problems during IC processing. For example, annealing such films at 800° C. often caused shorts in capacitors. The shorts can be reduced or avoided by lowering the annealing temperature to about 750° C. Lower annealing temperatures produce lower $2P_r$ values. Typically, annealing at 750° C. produces $2P_r$ values of about 10–12 $\mu C/cm^2$. A $2P_r$ range of about 18.6–22.6 $\mu C/cm^2$ was achieved using a 2 step anneal comprising a first anneal step at 750° C. for 1 hour followed by a second anneal step at 800° C. for about 1 hour. Since the intensity of the bumps corresponds to the intensity of the fluorite phase in the as-deposited film, problems associated with voids can be reduced by depositing a film under conditions which result in a film having lower intensity of fluorite phase. Thus, films with lower intensity of fluorite phase, depending on yield requirements, can be used.

A TEM analysis of SBT films formed from XRD amorphous films shows that the films were dense and homogeneous after annealing at 750° C. and 800° C. No interfacial layer was present between the electrode and the SBT film. The TEM analysis further reveals that the hillock-like bumps with a void underneath were absent from the amorphous films. The overall roughness of the films is lower than those of films formed from fluorite containing as-deposited films. The lateral grain size of the films after annealing at 750° C. for about 1 hour is about 200 nm. Such a large grain size in the film is beneficial as it produces a high remanent polarization.

SBT films formed from XRD amorphous films produced higher $2P_r$ values than those formed from fluorite-containing as-deposited films. $2P_r$ values of 21.2 $\mu C/m^2$ and 24.6 $\mu C/cm^2$ were achieved from the 750° C. and 800° C. anneals, respectively. Almost no shorts were observed in the capacitors, even after annealing at 800° C.

The transformation of substantially amorphous or XRD amorphous films into the ferroelectric phase was compared with conventional ferroelectrics formed from fluorite-containing films. Experiments have shown that amorphous films were transformed completely into the ferroelectric Aurivillius phase after 5 minutes at 750° C. and after 10 minutes at 700° C. In contrast, a fluorite-containing film takes more than, for example, 10 minutes at 750° C. to convert into the ferroelectric phase. Thus, at a given temperature, the ferro-anneal used to transform the amorphous films into the ferroelectric phase is much quicker than that for fluorite films, consuming a lower thermal budget.

Experiments have also shown that at comparable annealing temperatures and duration, higher remanant polarization values were achieved in a shorter amount of time with SBT ferroelectrics formed from amorphous films than with those formed from fluorite films. For example, annealing the amorphous film at 800° C. for about 2.5 minutes and 5 minutes produced $2P_r$ values of 8.5 and 12.5 $\mu C/cm^2$, respectively. Annealing the amorphous film at 730° C. for about 10 minutes produced a $2P_r$ value of about 6.9 $\mu C/cm^2$. On the other hand, annealing a fluorite film at 730° C. for about 10 minutes produce a $2P_r$ value of only about 1 $\mu C/cm^2$. A $2P_r$ value of about 8 $\mu C/cm^2$ was yielded after more than 60 minutes at 730° C. for the fluorite film.

While the invention has been particularly shown and described with reference to various embodiments, it will be recognized by those skilled in the art that modifications and changes may be made to the present invention without departing from the spirit and scope thereof the scope of the invention should therefore be determined not with reference to the above description but with reference to the appended claims along with their full scope of equivalents.

What is claimed is:

1. A method for forming a metal oxide ceramic layer capable of being transformed into a ferroelectric material, comprising the steps of:
   depositing the metal oxide ceramic layer in substantially amorphous form by chemical vapor deposition; and
   annealing the substantially amorphous metal oxide ceramic layer.

2. The method of claim 1, wherein the metal oxide ceramic layer comprises bismuth.

3. The method of claim 2, wherein the metal oxide ceramic layer is capable of being transformed into a ferroelectric layer by the annealing step.

4. The method of claim 3, wherein the metal oxide ceramic further comprises strontium and tantalum.

5. A method of forming a ferroelectric thin film comprising the steps of:
   depositing a substantially amorphous metal oxide ceramic layer by chemical vapor deposition; and
   annealing the substantially amorphous metal oxide ceramic layer under appropriate conditions to form the ferroelectric thin film.

6. The method of claim 5, wherein the substantially amorphous metal oxide ceramic layer is substantially free of fluorite phase.

7. The method of claim 5, wherein the metal oxide ceramic layer comprises bismuth.

8. The method of claim 7, wherein the metal oxide ceramic layer further comprises niobium.

9. The method of claim 7, wherein the metal oxide ceramic layer further comprises titanium.

10. The method of claim 7, wherein the metal oxide ceramic layer further comprises strontium.

11. The method of claim 10, wherein the metal oxide ceramic layer further comprises tantalum.

12. The method of claim 11, wherein the metal oxide ceramic layer further comprises niobium.

13. The method of claim 7, wherein the metal oxide ceramic layer further comprises tantalum.

14. The method of claim 5 wherein the substantially amorphous metal oxide ceramic layer comprises strontium bismuth tantalate.

15. The method of claim 5, wherein the substantially amorphous metal oxide layer is deposited on a first conductive material.

16. The method of claim 15 wherein the conductive material further comprises a conductive barrier layer.

17. The method of claim 15 wherein the first conductive material serves as a bottom electrode of a capacitor structure.

18. The method of claim 17, wherein the bottom electrode comprises a noble metal.

19. The method of claim 17 wherein the bottom electrode comprises a noble metal selected from the group consisting of: Pt, Pd, Au, Ir, and Rh.

20. The method of claim 17, wherein the bottom electrode comprises a conducting metal oxide.

21. The method of claim 17, wherein the bottom electrode comprises a conducting metal oxide selected from the group consisting of: $IrO_x$, $RhO_x$, $RuO_x$, $OsO_x$, $ReO_x$, $WO_x$, wherein x is greater than 0 and less than about 2.

22. The method of claim 17, wherein the bottom electrode comprises a conducting metal nitride.

23. The method of claim 17, wherein the bottom electrode comprises a conducting metal nitride selected from the group consisting of $TiN_x$ and $ZrN_x$, wherein x is greater than 0 and less than about 1.1.

24. The method of claim 17, wherein the bottom electrode comprises a conducting metal nitride selected from the group consisting of: $WN_x$ and $TaN_x$, wherein x is greater than 0 and less than about 1.7.

25. The method of claim 17, wherein the bottom electrode comprises a super conducting metal oxide.

26. The method of claim 17, wherein the bottom electrode comprises a super conducting oxide selected from the group consisting of $YBa_2Cu_2O_{7-x}$ and $Bi_2Sr_2Ca_2Cu_2O_{10}$.

27. The method of claim 5, wherein a second conductive layer is deposited over the ferroelectric thin film.

28. The method of claim 27, wherein the second conductive layer is platinum.

29. The method of claim 27, wherein the second conductive material serves as a top electrode of a capacitor structure.

30. The method of claim 5, wherein the ferroelectric thin film comprises an Aurivillius phase having a layered perovskite structure.

31. The method of claim 30, wherein the ferroelectric thin film comprises bismuth.

32. The method of claim 5, wherein the ferroelectric thin film comprises a layered perovskite structure.

33. The method of claim 32, wherein the ferroelectric thin film is expressed by the formula $SrBi_2Ta_2O_9$.

34. The method of claim 32, wherein the ferroelectric thin film is a derivative of SBT.

35. The method of claim 32, wherein the ferroelectric thin film is selected from the group consisting of: $SrBi_2Ta_{2-x}Nb_xO_9$, wherein x is greater than 0 and less than 2; $SrBi_2Nb_2O_9$; $Sr_{1-x}Ba_xBi_2Ta_{2-y}Nb_yO_0$ wherein x is greater than 0 and less than i and y is greater than 0 and less than 2; $Sr_{1-x}Ca_xBi_2Ta_{2-y}Nb_yO_9$ is greater than 0 and less than 1 and y is greater than 0 and less than 2; $Sr_{1-x}Pb_xBi_2Ta_{2-y}Nb_yO_9$, wherein x is greater than 0 and less than 1 and y is greater than 0 and less than 2; and $Sr_aBa_bCa_cPb_{1-a-b-c}Bi_2Ta_xNb_{2-x}O_9$, wherein a+b+c is greater than 0 and less than 1 and x is greater than 0 and less than 2.

36. The method of claim 32, wherein the ferroelectric thin film is expressed by the formula:

$$(Bi_2O_2)^{2+}(A_{m-1}B_mO_{3m+1})^{2-}$$

wherein A is selected from the group consisting of: $Bi^{3+}$, $L^{3+}$, $L^{+2}$, $Ca^{2+}$, $Sr^{2+}$, $Ba^{2+}$, $Pb^{2+}$ and $Na^+$; B is selected from the group consisting of: $Fe^{3+}$, $Al^{3+}$, $Sc^{3+}$, $Y^{3+}$, $Ti^{4+}$, $Nb^{5+}$, $Ta^{5+}$, $W^{5+}$, $Mo^{6+}$ and Lanthanide metals and m is selected from the group consisting of 1 to 5.

37. The method of claim 36, wherein B is Ta.

38. The method of claim 37 wherein A is Sr.

39. The method of claim 36, wherein B is titanium.

40. The method of claim 5, wherein the substantially amorphous metal oxide ceramic layer is deposited by liquid delivery chemical vapor deposition.

41. The method of claim 40, wherein the substantially amorphous metal oxide ceramic layer is deposited from organometallic precursors.

42. The method of claim 41, wherein the substantially amorphous metal oxide ceramic layer comprises bismuth, strontium and tantalum.

43. The method of claim 41, wherein the substantially amorphous metal oxide ceramic layer is deposited from $Bi(thd)_3$, $Sr(thd)_2$(pentamethyldiethylenetriamine) and $Ta(thd)(OiPr)_4$.

44. The method of claim 43, wherein the organometallic precursors are dissolved in a solvent system comprising octane:decane:pentamethyldiethylenetriamine in a 5:4:1 volumetric ratio.

45. The method of claim 40, wherein the substantially amorphous metal oxide ceramic layer is deposited from one or more organometallic precursor solutions.

46. The method of claim 45, wherein one of the organometallic precursor solutions comprises a Bi precursor.

47. The method of claim 45, wherein one of the organometallic precursor solutions comprises a Bi(β-diketonate).

48. The method of claim 45, wherein one of the organometallic precursor solutions comprises $Bi(thd)_3$.

49. The method of claim 45, wherein one of the organometallic precursor solutions comprises a bismuth precursor selected from the group consisting of: bismuth alcoxides, bismuth carboxylates, bismuth amides, and Bi aryls.

50. The method of claim 45, wherein one of the organometallic precursor solutions comprises Sr(β-diketonate).

51. The method of claim 45, wherein one of the organometallic precursor solutions comprises a Sr precursor selected from the group consisting of, $Sr(thd)_2$ and $Sr(thd)_2$ (adduct).

52. The method of claim 45, wherein one of the organometallic precursor solutions comprises a Sr precursor selected from the group consisting of, $Sr(thd)_2$ (pentamethyldiethylenetriamine) and $Sr(thd)_2$(tetraglyme).

53. The method of claim 45, wherein one of the organometallic precursor solutions comprises a tantalum precursor.

54. The method of claim 45, wherein one of the organometallic precursor solutions comprises Ta(β-diketonate).

55. The method of claim 45, wherein one of the organometallic precursor solutions comprises a tantalum precursor having the general formula Ta(β-diketonate)$_x$(alcoxide)$_{5-x}$.

56. The method of claim 54, wherein the tantalum precursor is $Ta(thd)(OiPr)_4$.

57. The method of claim 5, wherein the substantially amorphous metal oxide ceramic layer is deposited at a temperature between 280° C. and 450° C.

58. The method of claim 5, wherein the substantially amorphous metal oxide ceramic layer is deposited at a temperature of about 380° C.

59. The method of claim 5, wherein the substantially amorphous metal oxide ceramic layer is deposited at a deposition pressure between 0.1 and 760 Torr.

60. The method of claim 5, wherein the substantially amorphous metal oxide ceramic layer is deposited at a deposition pressure between 8 and 10 Torr.

61. The method of claim 5, wherein the substantially amorphous metal oxide ceramic layer is annealed at a temperature between 600–830° C. for about 1–60 minutes.

62. A capacitor comprising a ferroelectric thin film formed by the method of claim 5.

* * * * *